(12) United States Patent
Yoshimura et al.

(10) Patent No.: US 6,354,832 B1
(45) Date of Patent: Mar. 12, 2002

(54) SUBSTRATE PROCESSING APPARATUS AND SUBSTRATE PROCESSING METHOD

(75) Inventors: Yuta Yoshimura; Kei Miyazaki, both of Kumamoto; Kyoshige Katayama, Kamoto-gun; Takeshi Tamura, Kikuchi-gun, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/627,097

(22) Filed: Jul. 27, 2000

(30) Foreign Application Priority Data

Jul. 28, 1999 (JP) ............................................ 11-213995

(51) Int. Cl.[7] .............................................. F27D 7/02
(52) U.S. Cl. ............................ 432/247; 432/5; 432/81; 118/725; 118/728
(58) Field of Search .................... 432/5, 6, 81, 230, 432/247; 118/627, 642, 722, 724, 725, 728

(56) References Cited

U.S. PATENT DOCUMENTS

| | | | | |
|---|---|---|---|---|
| 5,201,653 A | * | 4/1993 | Hasegawa et al. | 432/5 |
| 5,516,367 A | * | 5/1996 | Lei et al. | 118/725 |
| 5,716,207 A | * | 2/1998 | Mishina et al. | 432/5 |
| 5,778,968 A | * | 7/1998 | Hendrickson et al. | 118/725 |
| 5,804,089 A | * | 9/1998 | Suzuki et al. | 118/724 |
| 5,858,100 A | * | 1/1999 | Maeda et al. | 118/728 |

* cited by examiner

Primary Examiner—Gregory Wilson
(74) Attorney, Agent, or Firm—Rader, Fishman & Grauer, PLLC

(57) ABSTRACT

In a heat processing apparatus of a low-oxygen curing and cooling processing station, a plurality of blast ports are provided in a ring shutter along a thickness direction of a wafer and a heated inert gas is supplied into a heat processing chamber via the blast ports, so that both faces of the wafer can be heated while the inside of the heat processing chamber is exchanged for the inert gas. Accordingly, heat processing for the substrate can be efficiently performed in a short period of time.

14 Claims, 13 Drawing Sheets

SUBSTRATE PROCESSING APPARATUS AND SUBSTRATE PROCESSING METHOD

CROSS-REFERENCE TO RELATED APPLICATIONS

This application is based upon and claims the benefit of priority from the prior Japanese Patent Application No. 11-213995, filed Jul. 28, 1999, the entire contents of which are incorporated herein by reference.

BACKGROUND OF THE INVENTION

The present invention relates to a substrate processing apparatus and a substrate processing method each for performing, for example, heat processing and cooling processing for a substrate such as a semiconductor wafer or the like.

In processes of semiconductor device fabrication, a layer insulating film is formed, for example, by an SOD (Spin on Dielectric) system. In this SOD system, a wafer is coated with a coating film by spinning the wafer, and chemical processing, heat processing, or the like is performed for the wafer by, for example, a sol-gel process to thereby form a layer insulating film thereon.

When a layer insulating film is formed by the sol-gel process, for example, first an insulating film material, for example, a solution in which colloids of TEOS (tetraethoxysilane) are dispersed in an organic solvent is supplied onto a semiconductor wafer (hereinafter referred to as "wafer"). Thereafter, the wafer to which the solution is supplied is subjected to gelling processing, and then exchange of solvents is performed. Subsequently, the wafer on which solvents are exchanged undergoes heat processing.

In a series of these processes, various heat processing and cooling processing are performed. Commonly in the heating process, a wafer is carried into a heat processing chamber and the inside of the processing chamber is brought to a low-oxygen atmosphere while the wafer is supported by supporting members. After the low-oxygen atmosphere is reached, the wafer is mounted on a hot plate and subjected to heat processing. When the wafer is subjected to the heat processing at a high temperature, the processing is performed in a low-oxygen atmosphere to prevent oxidation of a coating film made of an insulating film material. Such a low-oxygen atmosphere is generally made by exchanging the inside of the processing chamber for $N_2$ gas that is an inert gas. Further, in the cooling process, a wafer is mounted on a chill plate in a processing chamber and subjected to cooling processing while the inside of the processing chamber is brought to a low-oxygen atmosphere so that an inert gas is sent from a jet port disposed at a top portion of the processing chamber toward the front face of the wafer.

However, since the wafer is mounted on the hot plate and subjected to the heat processing after the processing chamber is brought to a low-oxygen atmosphere as described above, there is a disadvantage that the formation of a desired low-oxygen atmosphere requires considerable time, and the time required for heat processing under a low oxygen is virtually lengthened, thereby exerting a bad influence on a total processing time to form an insulating film to be formed on the wafer. Further, since the heating is performed by the hot plate, there is a disadvantage that the heat processing can not be uniformly performed for the entire face of a wafer, whereby heating unevenness occurs.

Furthermore, there is a disadvantage that in the cooling processing, the inert gas which is supplied toward the front face of the wafer becomes uneven within the surface, whereby cooling unevenness within the wafer surface occurs.

BRIEF SUMMARY OF THE INVENTION

An object of the present invention is to provide a substrate processing apparatus and a substrate processing method capable of performing a heating process without heating unevenness in a short period of time.

Another object of the present invention is to provide a substrate processing apparatus and a substrate processing method without cooling unevenness.

To solve the aforesaid disadvantages, a substrate processing apparatus of the present invention comprises: a hot plate on which the substrate is mounted; an ascendable and descendable supporting member penetrating the hot plate for protruding from a front face of the hot plate to support the substrate in a state where the supporting member is raised and for retracting into the front face of the hot plate to mount the substrate on the hot plate in a state where the supporting member is lowered; a processing chamber having an ascendable and descendable shutter member disposed to surround the outer periphery of the substrate and provided with a plurality of blast ports along a thickness direction of the substrate mounted on the hot plate, the shutter member forming processing space between the shutter member and the hot plate in a state where the shutter member is raised or lowered; and inert gas supply means for supplying a heated inert gas into the processing chamber via the blast ports.

In the present invention, the plurality of blast ports are provided in the shutter member along the thickness direction of the substrate, so that the heated inert gas to be supplied via the blast ports is sent to both faces of the substrate in a state where the substrate is supported by the supporting member.

Accordingly, both the faces of the substrate can be heated at the same time, whereby the substrate is uniformly heated within the surface and heating unevenness never occurs. Further, because heating of the substrate can be performed by the inert gas during the interval from when the substrate is supported by the supporting member to when it is mounted on the hot plate, the time required for the heat processing can be shortened compared with the case where conventionally the heat processing is performed by the hot plate after the low-oxygen atmosphere is prepared. Furthermore, the inert gas is supplied to both the faces of the substrate in a direction almost horizontal to the substrate, whereby the inert gas also has a function of separating oxygen remaining in the processing chamber from the substrate, so that oxidation of the coating film formed on the substrate never proceeds even in a heating state.

An embodiment of the present invention is characterized in that the substrate supported by the supporting member is positioned at a position to which the substrate is delivered from the outside of the apparatus and near a midpoint of vertically placed blast ports in a state where the shutter member is raised or lowered to form the processing space between the shutter member and the hot plate. According to the above configuration, the inert gas to be sent from the blast ports can be supplied to both the faces of the substrate, whereby heating unevenness never occurs.

An embodiment of the present invention is characterized in that the supporting member to which the substrate is delivered from the outside of the apparatus is lowered to mount the substrate on the hot plate in a state where the shutter member is raised or lowered to form the processing space between the shutter member and the hot plate and the heated inert gas is supplied from the blast ports. According to the above configuration, a supply process of the inert gas and a heating process can be performed at the same time during the interval of the movement of the substrate from when the substrate is supported by the supporting member to when it is mounted on the hot plate, whereby the time required for the heat processing can be shortened compared with the case where conventionally the heat processing is performed by the hot plate after the low-oxygen atmosphere is prepared.

An embodiment of the present invention is characterized in that the inert gas supply means exchanges the inside of the processing chamber for the inert gas by supplying the inert gas with gradually increasing the supply amount thereof. According to the above configuration, the supply amount of the inert gas is gradually increased, whereby the temperature can be efficiently raised while oxidation of the coating film formed on the substrate is prevented and the heat processing time can be shortened compared with the conventional art. In other words, oxidation tends to proceed with increasing temperature in the coating film formed on the substrate, but it is possible to decrease the oxygen concentration in the processing chamber with increasing temperature to a high temperature state in the configuration of the present invention, so that efficient heat processing can be realized while oxidation of the coating film is prevented.

A substrate processing apparatus of the present invention comprises: a chill plate on which the substrate is mounted; a processing chamber in which processing space for processing the substrate is formed between the processing chamber and the chill plate; inert gas supply means for supplying a cooled inert gas; and an inert gas jet nozzle provided above almost the center of the substrate mounted on the chill plate and having a jet port for slantingly jetting the inert gas supplied from the inert gas supply means toward the outer periphery of the substrate.

The present invention has the inert gas jet nozzle having the jet port for slantingly jetting the inert gas toward the outer periphery of the substrate, whereby the inert gas can be uniformly supplied to the entire face of the substrate, so that cooling unevenness never occurs within the substrate surface.

A substrate processing method of the present invention comprises the steps of: (a) carrying a substrate to a position above a hot plate; (b) lowering the substrate while a heated inert gas is supplied from the outer periphery side of the substrate to both faces of the substrate; and (c) heating the substrate while the substrate is mounted on the hot plate.

In the present invention, the heated inert gas is supplied to both the faces of the substrate, whereby the entire face of the substrate can be heated without unevenness.

An embodiment of the present invention is characterized in that the heat inert gas is supplied with the supply amount thereof gradually increased in the step (b). According to the configuration, the temperature can be efficiently raised while oxidation of the coating film formed on the substrate is prevented and the heat processing time can be shortened compared with the conventional art.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, embodiments of the present invention will be explained with reference to the drawings.

Figure 1:
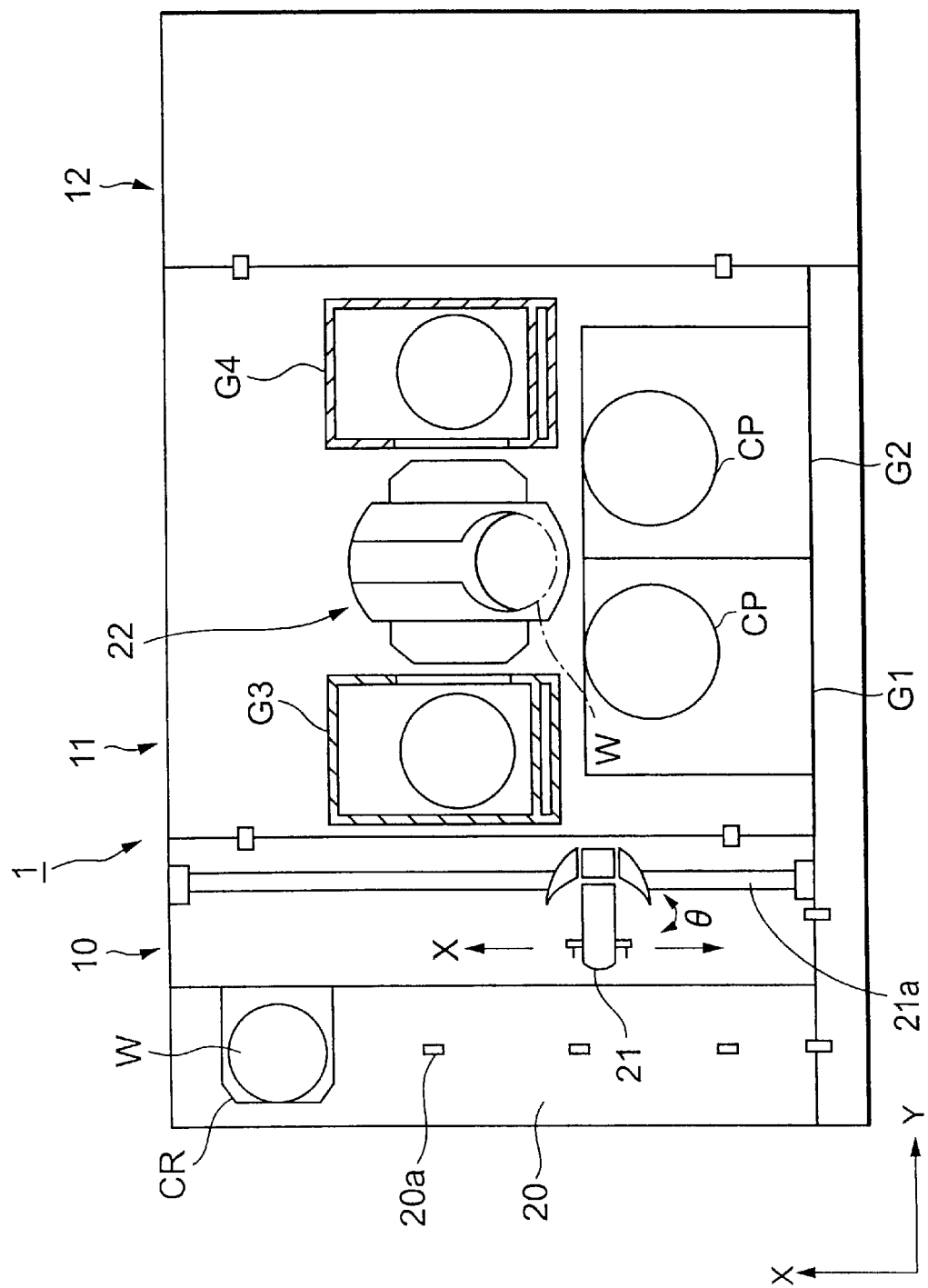
FIG. 1 is a plan view of an SOD system according to an embodiment of the present invention.
Figure 2:
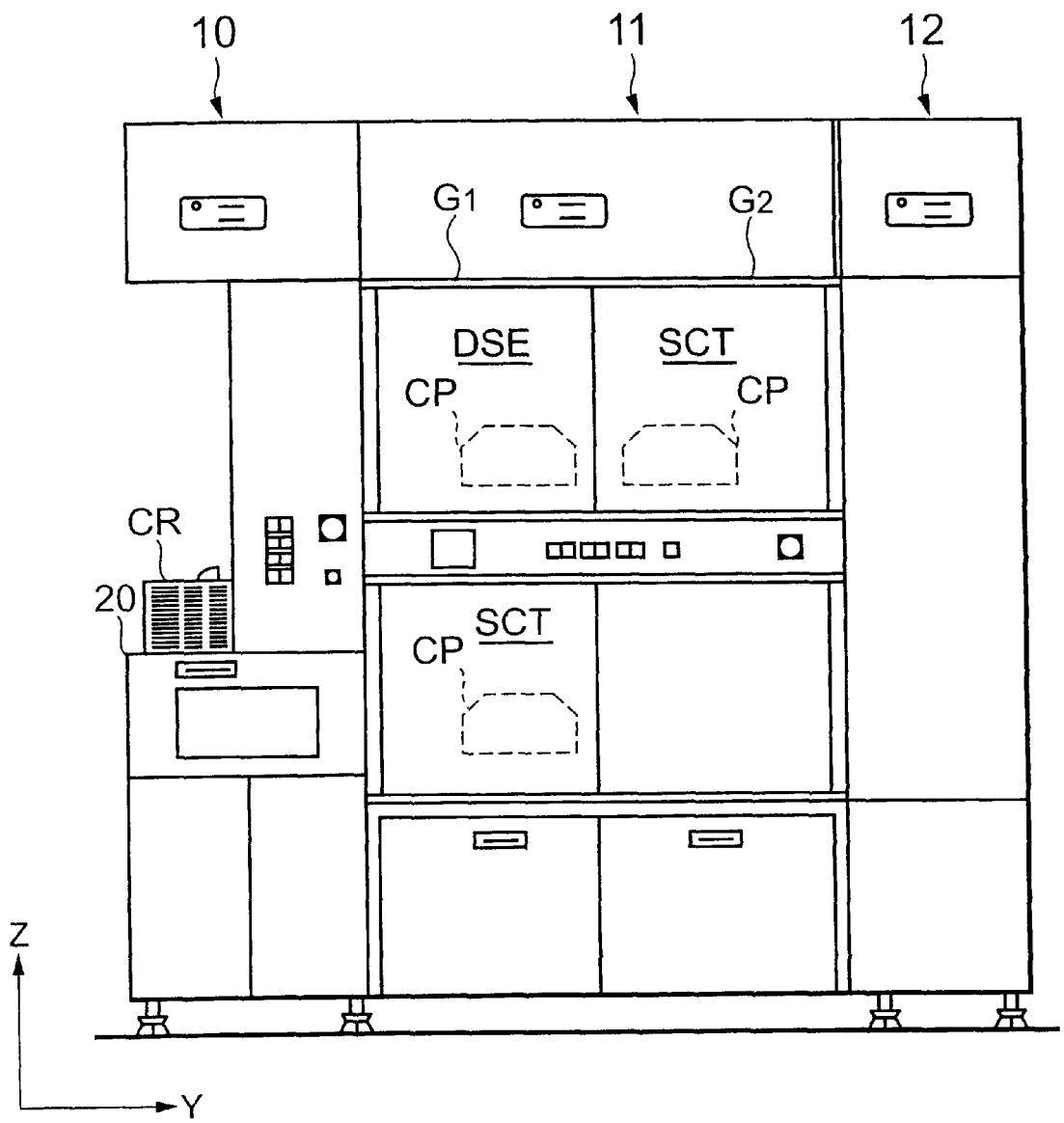
FIG. 2 is a front view of the SOD system shown in FIG. 1.
Figure 3:
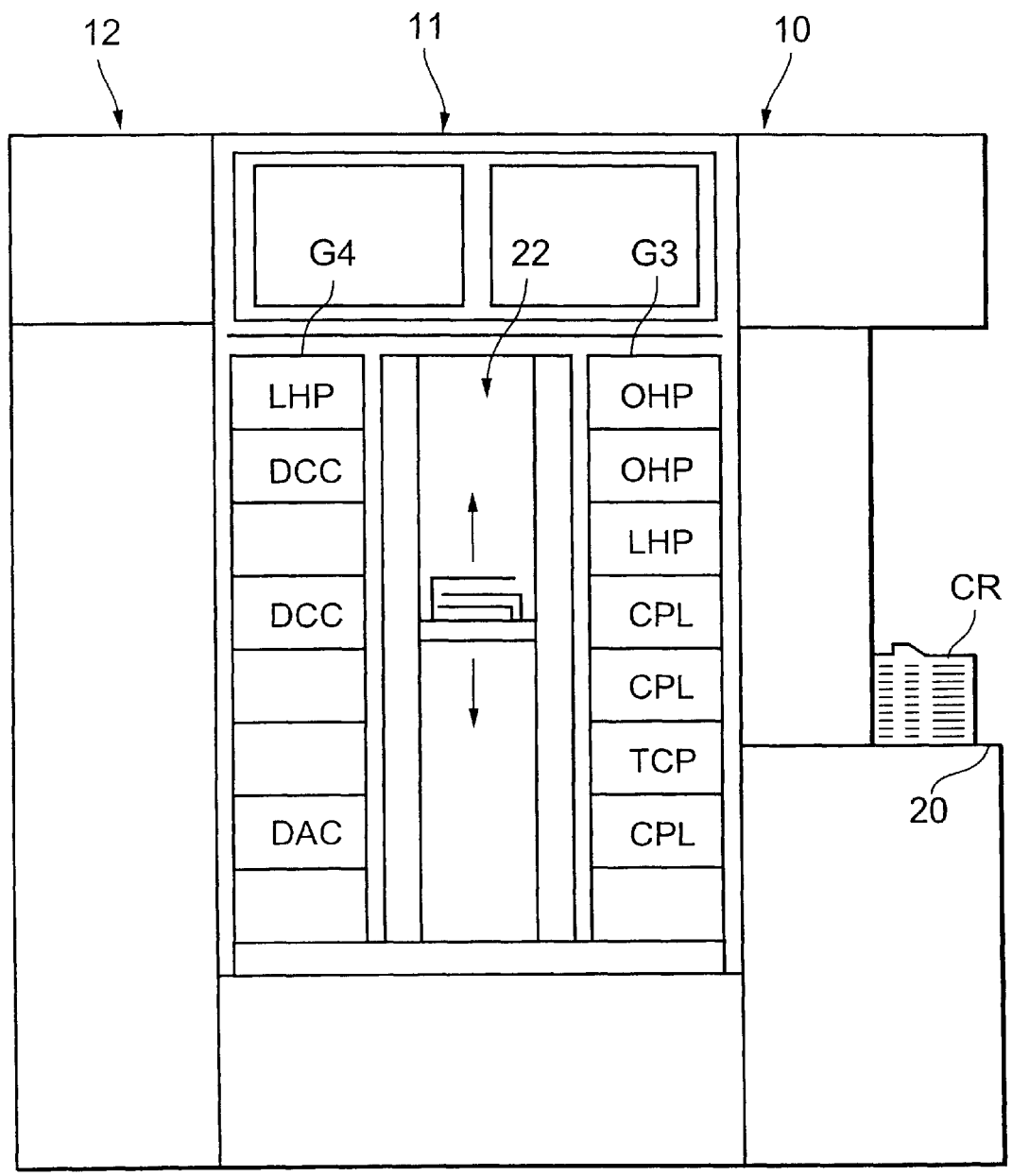
FIG. 3 is a rear view of the SOD system shown in FIG. 1.

First, an SOD (Spin on Dielectric) system as a substrate processing apparatus of the present invention will be explained. FIG. 1 to FIG. 3 are views showing the entire structure of the SOD system, FIG. 1 is a plan view, FIG. 2 is a front view, and FIG. 3 is a rear view.

The SOD system 1 has a cassette block 10 for transferring a plurality of, for example, 25 semiconductor wafers (hereinafter referred to as wafers) W as substrates, as a unit, in a wafer cassette CR from/to the outside into/from the system and carrying the wafer W into/out of the wafer cassette CR, a processing block 11 in which various kinds of processing stations each for performing predetermined processing for the wafers W one by one in an SOD coating process are multi-tiered at predetermined positions, and a cabinet 12 in which a bottle of ammonia water, a bubbler, a drain bottle, and the like required in an aging process are provided are integrally connected.

In the cassette block 10, as shown in FIG. 1, a plurality of, for example, up to four wafer cassettes CR are mounted with respective wafer transfer ports facing the processing block 11 side at positions of projections 20a on a cassette mounting table 20 in a line in an X-direction. A wafer transfer body 21 movable in the direction of arrangement of cassettes (an X-direction) and in the direction of arrangement of wafers housed in the wafer cassette CR (a Z-vertical direction) selectively gets access to each of the wafer cassettes CR. The wafer transfer body 21 is also structured to be rotatable in a θ-direction so as to be accessible to a transfer and chill plate (TCP) included in a multi-tiered station section of a third group G3 on the processing block 11 side as will be described later.

In the processing block 11, as shown in FIG. 1, a vertical transfer-type main wafer transfer mechanism 22 is disposed in the center thereof. Around the main wafer transfer mechanism 22, all processing stations composing a group or a plurality of groups are multi-tiered. In this embodiment, four groups G1, G2, G3, and G4 each having multi-tiered stations are arranged. Multi-tiered stations of the first and second groups G1 and G2 are arranged side by side on the front side (the lower side in FIG. 1) of the system, multi-tiered stations of the third group G3 are arranged adjacent to the cassette block 10, and multi-tiered stations of the fourth group G4 are arranged adjacent to the cabinet 12.

As shown in FIG. 2, in the first group G1, an SOD coating processing station (SCT) for supplying an insulating film material while the wafer W is mounted on a spin chuck in a cup CP and applying a uniform insulating film on top of the wafer by rotating the wafer and a solvent exchange processing station (DSE) for supplying a chemical for exchange such as HMDS, heptane, or the like while the wafer W is mounted on a spin chuck in a cup CP and exchanging a solvent in the insulating film applied on top of the wafer for another solvent prior to a drying process are two-tiered from the bottom in order.

In the second group G2, an SOD coating processing station (SCT) is arranged at the upper tier. Incidentally, it is possible to arrange an SOD coating processing station (SCT), a solvent exchange processing station (DSE), or the like at the lower tier of the second group G2 if necessary.

As shown in FIG. 3, in the third group G3, two low-oxygen and high-temperature heat processing stations (OHP), a low-temperature heat processing station (LHP), two cooling processing stations (CPL), a transfer and chill plate (TCP), and a cooling processing station (CPL) are multi-tiered from the top in order. Here the low-oxygen and high-temperature heat processing station (OHP) has a hot plate on which the wafer W is mounted inside a sealable processing chamber, exhausts air from the center of the top portion of the processing chamber while discharging $N_2$ uniformly from ports around the outer periphery of the hot plate, and performs high-temperature heat processing for the wafer W in a low-oxygen atmosphere. The low-temperature heat processing station (LHP) has a hot plate on which the wafer W is mounted and performs low-temperature heat processing for the wafer W. The cooling processing station (CPL) has a chill plate on which the wafer W is mounted and performs cooling processing for the wafer W. The transfer and chill plate (TCP) has a two-tiered structure with a chill plate for cooling the wafer W at the lower tier and a delivery table at the upper tier and performs transfer of the wafer W between the cassette block 10 and the processing block 11.

In the fourth group G4, a low-temperature heat processing station (LHP), two low-oxygen curing and cooling processing stations (DCC), and an aging processing station (DAC) are multi-tiered from the top in order. Here the low-oxygen curing and cooling processing station (DCC) has a hot plate and a chill plate such that they are adjacent to each other in a sealable processing chamber, performs high-temperature heat processing for the wafer W in a low-oxygen atmosphere in which exchange for $N_2$ is performed and performs cooling processing for the wafer W subjected to heat processing. The aging processing station (DAC) introduces $NH_3+H_2O$ into a sealable processing chamber to perform aging processing for the wafer W, whereby an insulating film material film on the wafer W is wet gelatinized.

Figure 4:
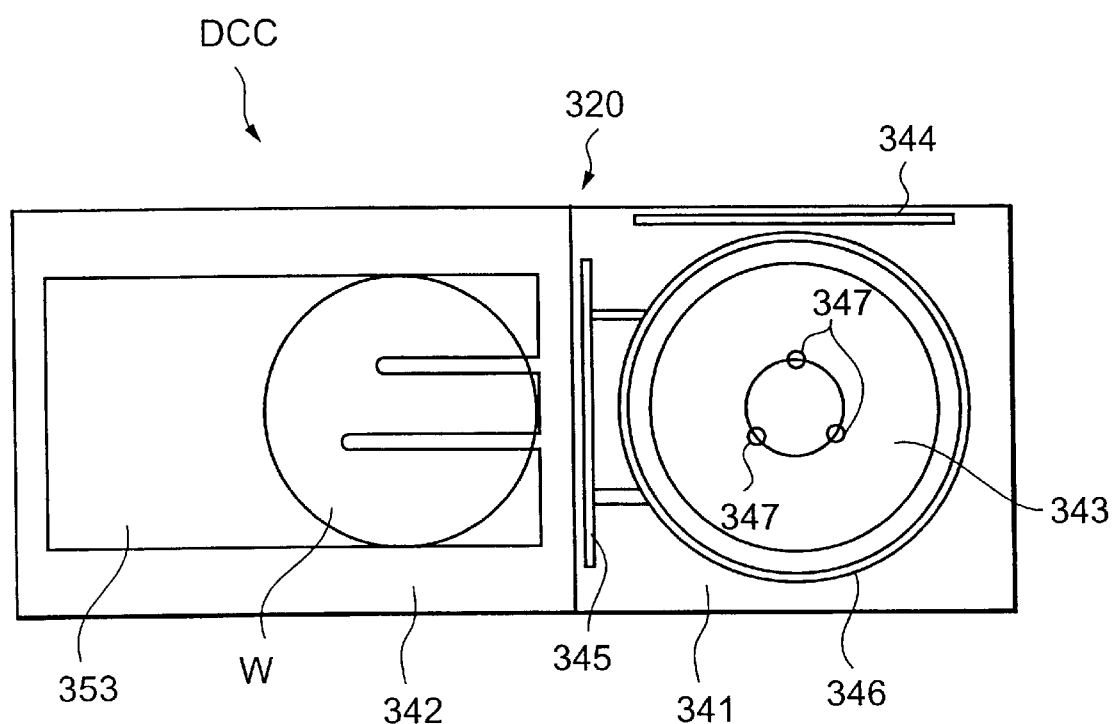
FIG. 4 is a plan view of a low-oxygen curing and cooling processing station according to the embodiment of the present invention.
Figure 5:
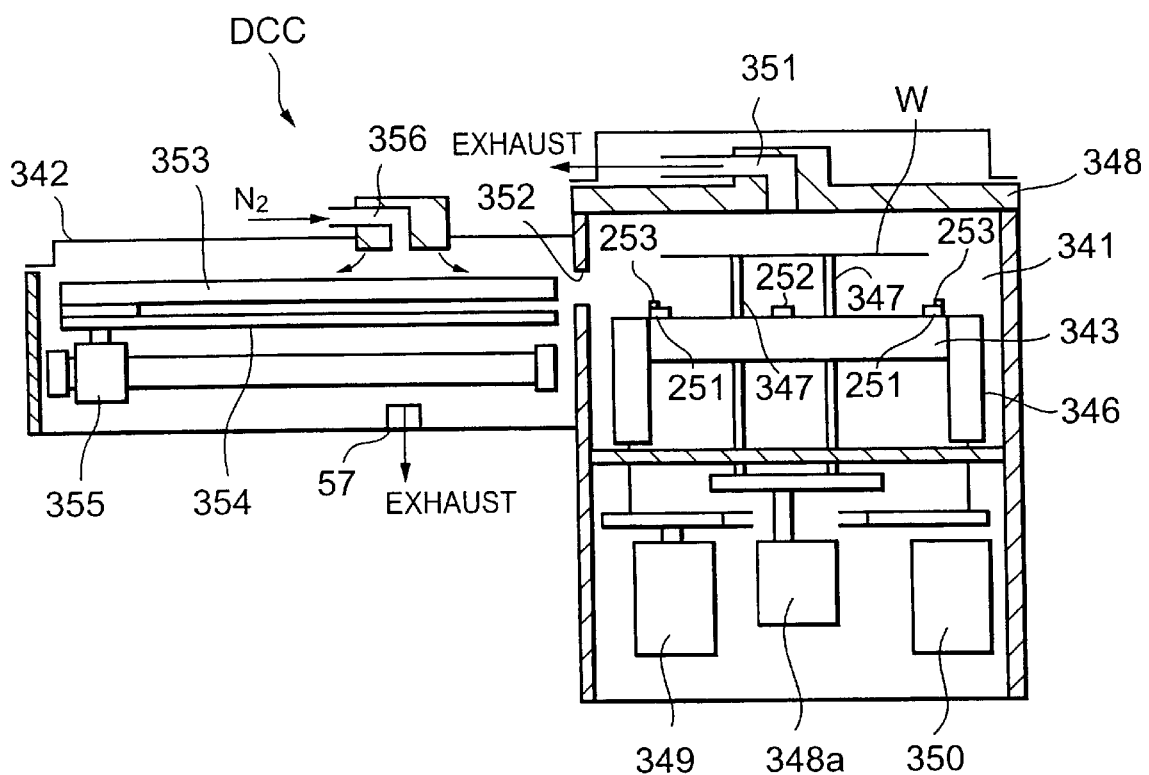
FIG. 5 is a sectional view of the low-oxygen curing and cooling processing station shown in FIG. 4.
Figure 6:
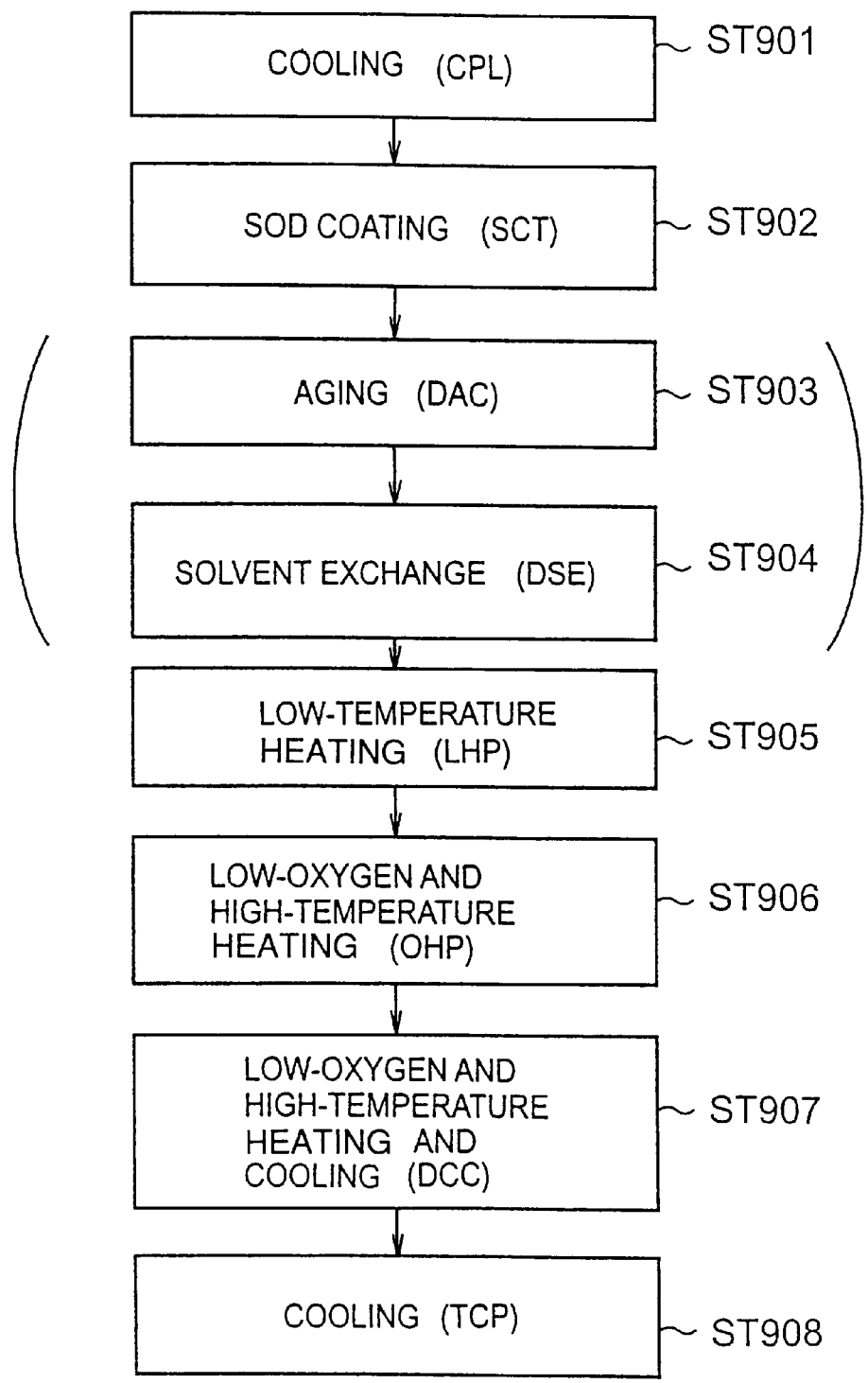
FIG. 6 is a flowchart showing operation steps of the SOD system according to the embodiment of the present invention.

FIG. 4 is a plan view of a low-oxygen curing and cooling processing station (DCC), and FIG. 5 is a sectional view thereof.

As shown in FIG. 4 and FIG. 5, the low-oxygen curing and cooling processing station (DCC) has a heat processing chamber 341 and a cooling processing chamber 342 provided adjacent thereto. The heat processing chamber 341 has a hot plate 343 which can be set at a temperature of 200° C. to 470° C. The low-oxygen curing and cooling processing station (DCC) further includes a first gate shutter 344 which is opened and shut when the wafer W is transferred from/to the main wafer transfer mechanism 22, a second gate shutter 345 for opening and shutting a portion between the heat processing chamber 341 and the cooling processing chamber 342, and a ring shutter 346 which is raised and lowered together with the second gate shutter 345 while surrounding the outer periphery of the wafer W around the hot plate 343. Moreover, three lifting pins 347, which are supporting members, penetrating the hot plate 343 for raising and lowering the wafer W while the wafer W is mounted thereon are provided to be ascendable and descendable. The lifting pins protrude from the front face of the hot plate 343 to support the wafer W nearly horizontally in a state where they are raised, and retract into the hot plate 343 to mount the wafer on the plate 343 in a state where they are lowered.

Provided below the heat processing chamber 341 are a raising and lowering mechanism 348a for raising and lowering the aforesaid three lifting pins 347, a raising and lowering mechanism 349 for raising and lowering the ring shutter 346 together with the second gate shutter 345, and a raising and lowering mechanism 350 for raising and lowering the first gate shutter 344 to open and shut it.

The heat processing chamber 341 and the cooling processing chamber 342 communicate with each other via a communicating port 352, and a chill plate 353 for cooling the wafer W while the wafer W is mounted thereon is structured to be movable in a horizontal direction along a guide plate 354 by means of a moving mechanism 355. Thereby, the chill plate 352 can get into the heat processing chamber 341 through the communicating port 352, receives the wafer W which has been heated by the hot plate 343 in the heat processing chamber 341 from the lifting pins 347, carries the wafer W into the cooling processing chamber 342, and returns the wafer W to the lifting pins 347 after the wafer W is cooled.

Hereinafter, respective structures of the heat processing chamber 341 and the cooling processing chamber 342 in the low-oxygen curing and cooling station (DCC) and apparatus operations in the low-oxygen curing and cooling processing station (DCC) will be explained in detail using FIG. 4, FIG. 5, and FIG. 7 to FIG. 10. FIG. 7 to FIG. 9 are flowcharts showing the apparatus operations of the low-oxygen curing and cooling processing station (DCC), and FIG. 10 is a graph showing changes over time in supply amount of an inert gas supplied into the heat processing chamber 341 during operation.

Figure 7A:
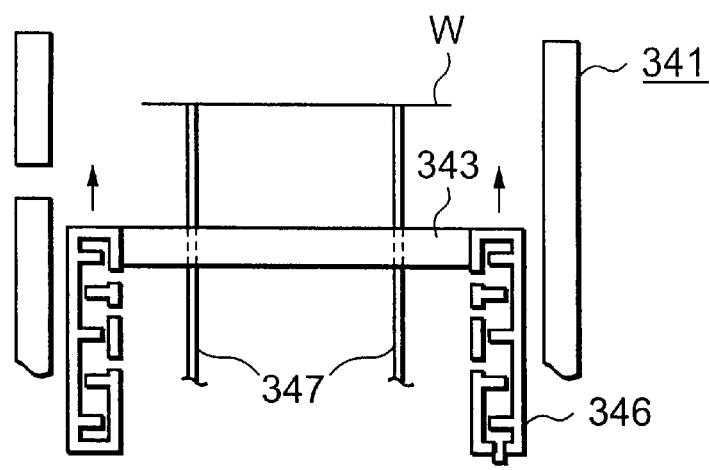
FIGS. 7A to 7C are a flowchart (first) showing an operation mechanism of the low-oxygen curing and cooling processing station according to the embodiment of the present invention.

First, the first gate shutter 344 is opened, the wafer W delivered from the main wafer transfer mechanism 22 is transferred into the heat processing chamber 341, and the lifting pins 347 horizontally supports the wafer W as shown in FIG. 7(a). At this time, the lifting pins 347 are in a state of being raised and the ring shutter 346 is in a state of being lowered.

Figure 7B:
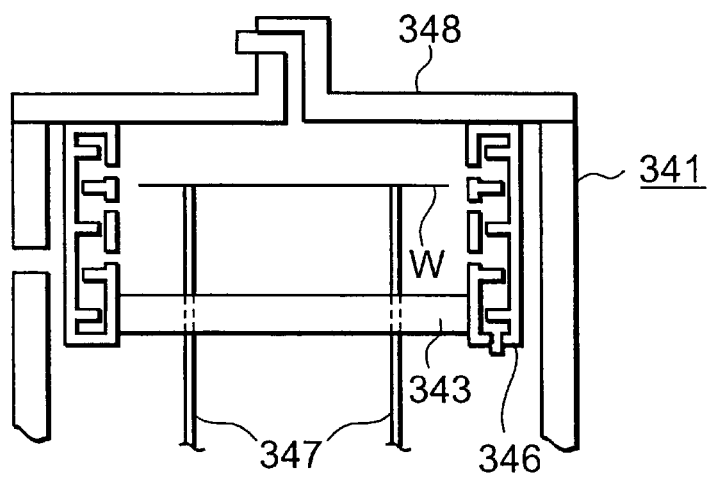

Next, as shown in FIG. 7(b), a lid body 348 is lowered simultaneously with the rise of the ring shutter 346, whereby processing space is formed with the hot plate 343, the ring shutter 346, and the lid body 348. The ring shutter 346 has a hollow structure in which a plurality of blast ports 346a are provided in the inner side face thereof in a thickness direction of the wafer W and further horizontal to the wafer W, and the plurality of blast ports 346a are uniformly provided on the entire inner side face of the ring shutter 346. Further, in a state where the processing space is formed, the wafer W is positioned near the midpoint of the vertically placed blast ports 346a.

Figure 7C:
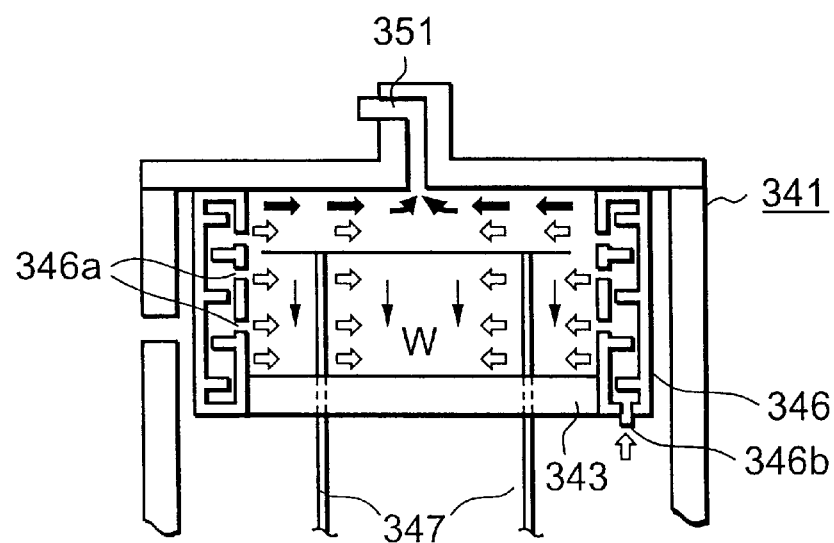
Figure 8A:
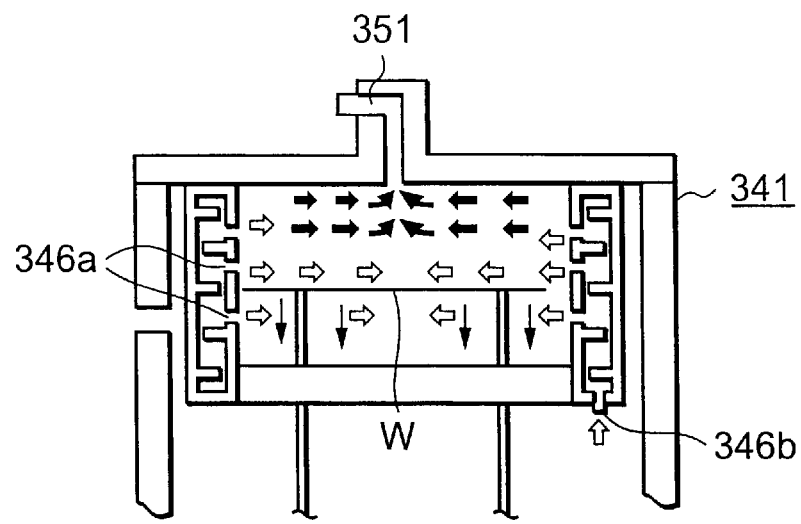
FIGS. 8A to 8C are a flowchart (second) showing the operation mechanism of the low-oxygen curing and cooling processing station according to the embodiment of the present invention.
Figure 9A:
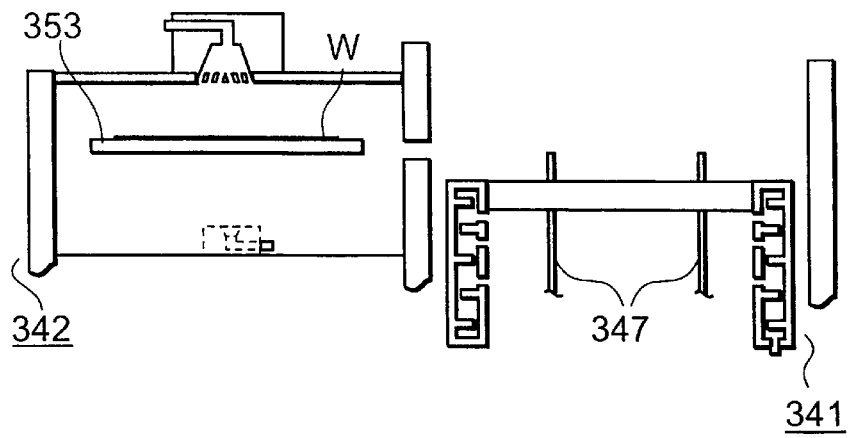
FIGS. 9A to 9C are a flowchart (third) showing the operation mechanism of the low-oxygen curing and cooling processing station according to the embodiment of the present invention.
Figure 9B:
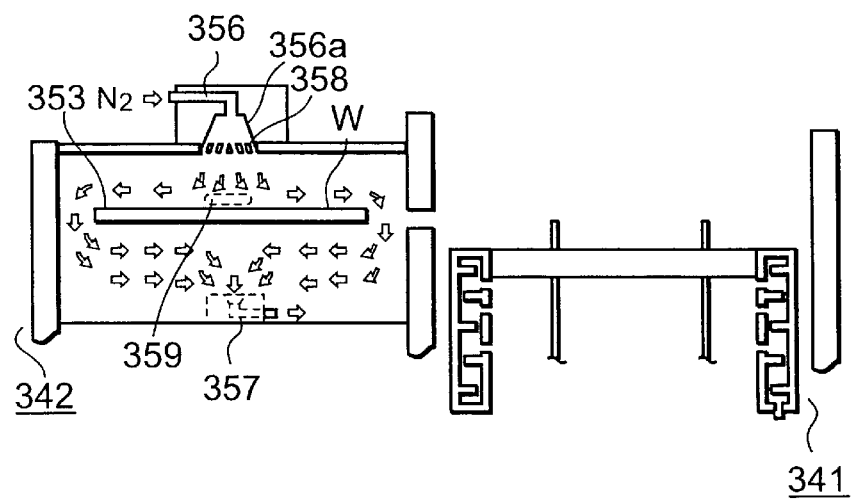

Next, as shown in FIG. 7(c) and FIG. 8(a), the heat processing chamber 341 is configured such that an inert gas such as $N_2$ or the like which is heated from room temperature to 470° C. is supplied thereinto via the blast ports 346a of the ring shutter 346, and additionally air therein is exhausted via an exhaust pipe 351. Then, during the interval that air inside the heat processing chamber 341 is exhausted and $N_2$ gas is simultaneously supplied to gradually bring the inside of the heat processing chamber 341 to a low-oxygen concentration atmosphere, the lifting pins 347 are lowered to lower the wafer W. During the interval that the wafer W is lowered and mounted on the hot plate 343, $N_2$ gas is supplied into the heat processing chamber 341 for 30 seconds with the supply amount $N_2$ gas gradually increased as shown in FIG. 10. The plurality of blast ports are provided in the inner side face of the ring shutter 346 in the thickness direction of the wafer W, whereby $N_2$ gas is supplied to both faces of the wafer W in the direction nearly horizontal to the wafer W during the interval that the wafer W is mounted on the hot plate 343, so that the wafer can be uniformly heated without unevenness. Further, the supply of $N_2$ gas with a gradual increase enables an efficient rise in temperature while oxidation of the coating film formed on the wafer W is prevented. Here, $N_2$ gas is supplied into the ring shutter 346 from one or a plurality of supply ports 346b provided at the lower portion of the ring shutter 346, passes through the internal space of the ring shutter 346, and is supplied into the heat processing chamber 341 via the blast ports 346a. In the internal space of the ring shutter 346, a plurality of valves 346c are formed so that $N_2$ gas is evenly supplied from the plurality of blast ports 346a into the heat processing chamber 341. The valves 346c are of ring shape and provided on the inner wall and the outer wall of the internal space of the ring shutter 346 in such a manner to alternately protrude therefrom.

Figure 8B:
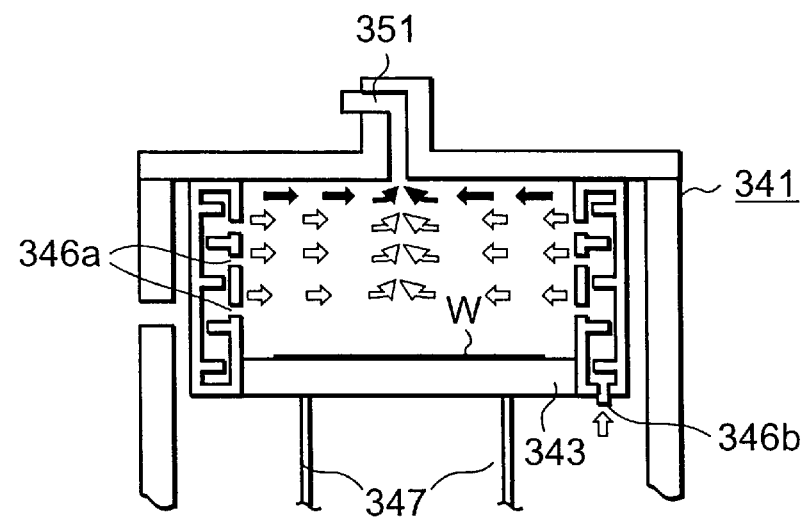

Next, as shown in FIG. 8(b), the wafer W is mounted on the hot plate 343. After the wafer W is mounted on the hot plate 343, $N_2$ gas is supplied into the heat processing chamber 341 for 30 seconds with the supply amount of 20 NL/min. remaining constant, further $N_2$ gas is supplied for 7 seconds with the supply amount gradually decreased, and then $N_2$ gas is supplied for 30 seconds with the supply amount of 10 NL/min. remaining constant as shown in FIG. 10. The inside of the processing space at the point of time when the wafer W is mounted on the hot plate 343 is maintained in a low-oxygen atmosphere of, for example, 50 ppm or less, and the temperature of the hot plate 343 at this time is 200° C. to 470° C. Here, when the wafer W is mounted on the hot plate 343, it is suitable to mount the wafer W on the hot plate 343 directly or with a proximity sheet therebetween.

Figure 8C:
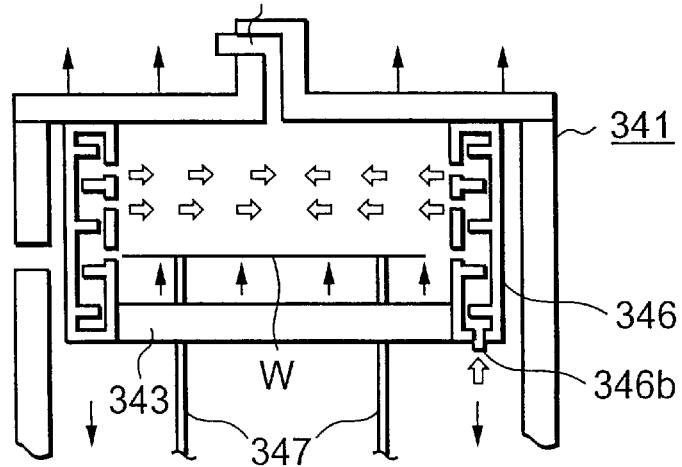

Next, as shown in FIG. 8(c), the ring shutter 346 is lowered and the lid body 348 is raised, and the lifting pins 347 are raised to receive the wafer W from the hot plate 343. At this time, $N_2$ gas is supplied with the supply amount gradually decreased as shown in FIG. 10, and finally the supply is stopped.

Next, the chill plate 353 gets into the heat processing chamber 341 and receives the wafer W from the lifting pins 347, and the lifting pins 347 are lowered. Then, as shown in FIG. 9(a), the chill plate 353 holding the wafer W is returned to the cooling processing chamber 342.

Next, the second gate shutter 345 is raised to thereby form processing space in the cooling processing chamber 342. The cooling processing chamber 342 is structured such that an inert gas such as $N_2$ or the like is supplied thereinto from supply means not shown via a supply pipe 356 that is a supply passage, and air inside the cooling processing chamber 342 is exhausted to the outside via an exhaust pipe 357 as shown in FIG. 9(b). The supply pipe 356 that is an inert gas jet nozzle is disposed above almost the center of the wafer W mounted on the chill plate 353 and has a jet port 356a for slantingly jetting $N_2$ gas toward the outer periphery of the wafer W. Further, a current plate 358 is disposed near the outlet of the supply pipe 356 to control directions of flows of $N_2$ gas. The jet port of the supply pipe 356 is formed into a tapered shape which slants toward the outer periphery of the wafer W, thereby controlling the flows of $N_2$ gas which the current plate 358 can not sufficiently control and sending $N_2$ gas to the entire face of the wafer W without unevenness. Furthermore, the jet port 356a is formed into a tapered shape, thereby preventing occurrence of an air stagnation 359 above the center of the wafer W and enabling the uniform cooling within the substrate face. Then, $N_2$ gas is supplied while air in the cooling processing chamber 342 is being exhausted, whereby the wafer W is cooled in an atmosphere with a low-oxygen concentration (for example, 50 ppm or less). The cooling temperature at this time is 150° C. to 400° C. by way of example. At that time, the wafer W is cooled under a low-oxygen concentration atmosphere, so that oxidation of the coating film is efficiently prevented. After the completion of the cooling processing, the supply of $N_2$ gas into the cooling processing chamber is stopped, thereby completing the cooling.

Figure 9C:
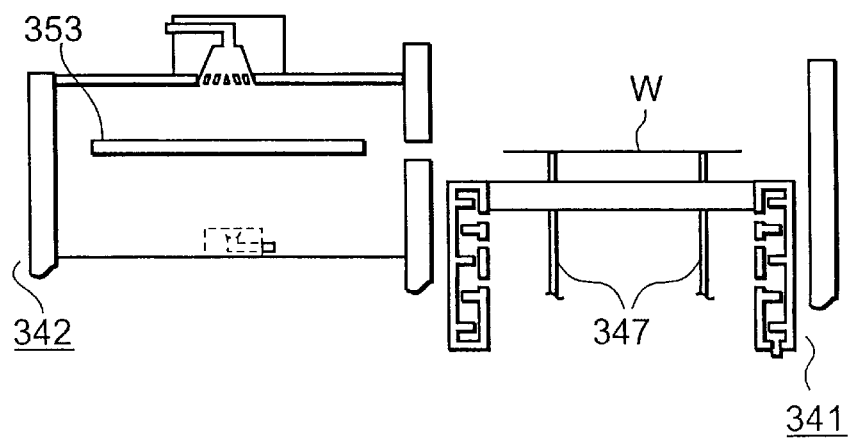
Figure 10:
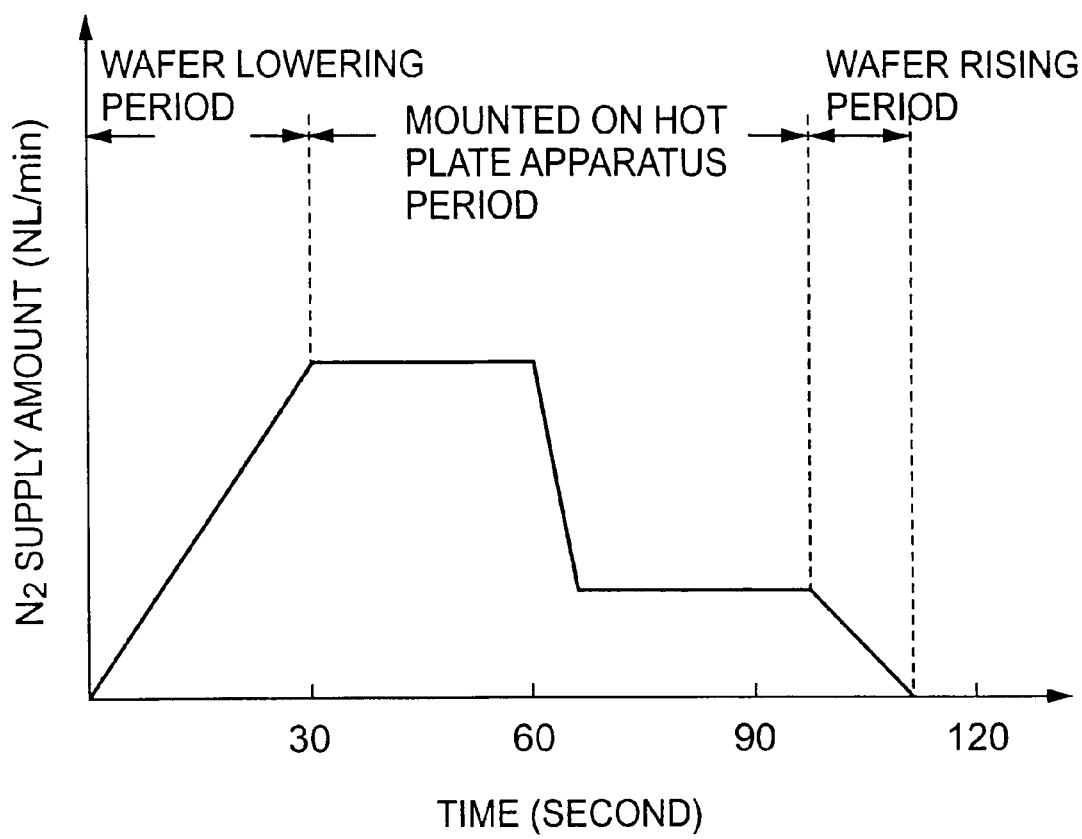
FIG. 10 is a graph showing an N2 supply amount in heating process in a heat processing chamber.

Next, as shown in FIG. 9(c), the second gate shutter 345 is lowered and the chill plate 353 gets into the heat processing chamber 341, and sequentially the lifting pins 347 are raised and the wafer W is returned from the chill plate 353 to the lifting pins 347. The chill plate 353 after carrying the wafer W out is returned into the cooling processing chamber and the first gate shutter 344 is opened, and the wafer W is returned to the main transfer mechanism. Thus, the heat processing and the cooling processing are completed.

Next, operations in the SOD system 1 thus structured will be explained. FIGS. 8 show a processing flow in this SOD system 1.

First, in the cassette block 10, the unprocessed wafer W is transferred from the wafer cassette CR to the delivery table in the transfer and chill plate (TCP) included in the third group G3 on the processing block 11 side by means of the wafer transfer body 21.

The wafer W transferred to the delivery table in the transfer and chill plate (TCP) is transferred to the cooling processing station (CPL) by means of the main wafer transfer mechanism 22. In the cooling processing station (CPL), the wafer W is cooled to a temperature suitable for processing in the SOD coating processing station (SCT) (STEP 901).

The wafer W which has undergone the cooling processing in the cooling processing station (CPL) is transferred to the SOD coating processing station (SCT) via the main wafer transfer mechanism 22. In the SOD coating processing station (SCT), the wafer W is subjected to SOD coating processing (STEP 902).

The wafer W which has undergone the SOD coating processing in the SOD coating processing station (SCT) is transferred to the aging processing station (DAC) via the main wafer transfer mechanism 22. In the aging processing station (DAC), $NH_3+H_2O$ is introduced into the processing chamber to thereby perform aging processing for the wafer W, whereby an insulating film material film on the wafer W is gelatinized (STEP 903).

The wafer W which has undergone the aging processing in the aging processing station (DAC) is transferred to the solvent exchange processing station (DSE) via the main wafer transfer mechanism 22. In the solvent exchange processing station (DSE), a chemical for exchange is supplied to the wafer W and processing for exchanging a solvent in the insulating film applied on top of the wafer for another solvent is performed (STEP 904).

The wafer W which has undergone the exchange processing in the solvent exchange processing station (DSE) is transferred to the low-temperature heat processing station (LHP) by means of the main wafer transfer mechanism 22. In the low-temperature heat processing station (LHP), the wafer W undergoes low-temperature heat processing (STEP 905).

The wafer W which has undergone the low-temperature heat processing in the low-temperature heat processing station (LHP) is transferred to the low-oxygen and high-temperature heat processing station (OHP) by means of the main wafer transfer mechanism 22. In the low-oxygen and high-temperature heat processing station (OHP), the wafer W undergoes high-temperature heat processing in a low-oxygen atmosphere (STEP 906).

The wafer W which has undergone the high-temperature heat processing in the low-oxygen and high-temperature heat processing station (OHP) is transferred to the low-oxygen curing and cooling processing station (DCC) by means of the main wafer transfer mechanism 22. In the low-oxygen curing and cooling processing station (DCC), the wafer W undergoes high temperature heat processing in a low-oxygen atmosphere and then cooling processing (STEP 907).

The wafer W which has been processed in the low-oxygen curing and cooling processing station (DCC) is transferred to the chill plate in the transfer and chill plate (TCP) by means of the main wafer transfer mechanism 22. The wafer W undergoes cooling processing on the chill plate in the transfer and chill plate (TCP) (STEP 908).

The wafer W which has undergone the cooling processing on the chill plate in the transfer and chill plate (TCP) is transferred to the wafer cassette CR via the wafer transfer body 21 in the cassette block 10.

In the SOD system 1 of this embodiment, the aging processing station (DAC) for performing aging processing for the wafer W coated with the insulating film material and the solvent exchange processing station (DSE) for performing solvent exchange processing for the wafer W which has undergone the aging processing are integrated with the system as described above, whereby total time required for substrate processing is extremely shortened. In addition, the plurality of blast ports are provided in the ring shutter of the heat processing chamber of the low-oxygen curing and cooling processing station (DCC) in the thickness direction of the wafer W, thereby supplying the inert gas to both faces of the wafer W and preventing heating unevenness. Moreover, after the wafer W is carried into the heat processing chamber, the supply of the inert gas is gradually increased until the wafer W is mounted on the hot plate, so that the substrate temperature can be efficiently raised while oxidation of the coating film formed on the wafer W is prevented and the virtual heat processing time can be shortened.

In the aforesaid embodiment, the processing space is formed in a state where the ring shutter 346 of the heat processing apparatus of the low-oxygen curing and cooling processing station (DCC) is raised. However, it is also suitable that, for example, the lid body 348 and the ring shutter 346 are integrated with each other and the processing space is formed in a state where the ring shutter is lowered.

Further, in the heat processing chamber 341 of the low-oxygen curing and cooling station (DCC), the plurality of blast ports are provided in the ring shutter 346 in the thickness direction of the wafer W and the inert gas is supplied with the supply amount increased until the wafer W is mounted on the hot plate 343. Such a configuration is also applicable to a heat processing apparatus using a hot plate, for example, the low-oxygen and high-temperature processing station (OHP).

Furthermore, in the aforesaid embodiment, the inert gas supply pipe of the cooling processing apparatus of the low-oxygen curing and cooling station (DCC) has the jet port having a shape of slanting toward the outer periphery of the substrate. Such a configuration is not limited to the cooling processing apparatus of DCC, but is also applicable to the case where a gas supply pipe is positioned above the center of the substrate and gas is supplied into the processing chamber via the supply pipe. Through the above configuration, gas can be uniformly supplied to the entire face of the substrate. Moreover, though the jet port is formed in a tapered shape in the aforesaid embodiment, the same effects can be obtained even if the jet port is formed, for example, in a shape wherein the port widens in staircase form toward the wafer W.

Next, another embodiment of the present invention will be explained.

Figure 11:
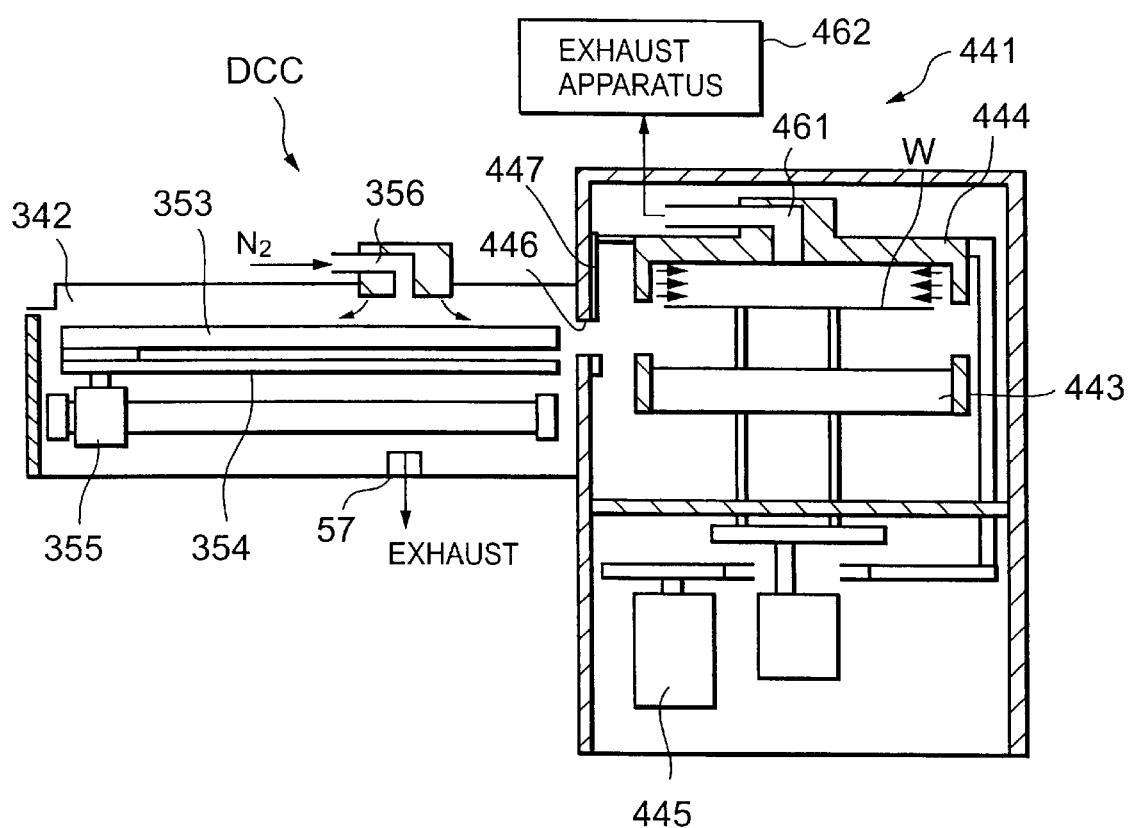
FIG. 11 is a sectional view of a low-oxygen curing and cooling processing station according to another embodiment of the present invention.

As shown in FIG. 11, a low-oxygen curing and cooling processing station (DCC) according to this embodiment has a heat processing chamber 441 and a cooling processing chamber 342 provided adjacent thereto and having the same structure as that of the first embodiment.

The heat processing chamber 441 has a hot plate 443 which can be set at a temperature of 200° C. to 470° C. Moreover, above the hot plate 443, a lid body 444 is disposed to be ascendable and descendable so as to cover the wafer W mounted on the hot plate 443. The lid body 444 is driven to ascend and descend by a raising and lowering mechanism 445 disposed below the heat processing chamber 441.

Figure 12:
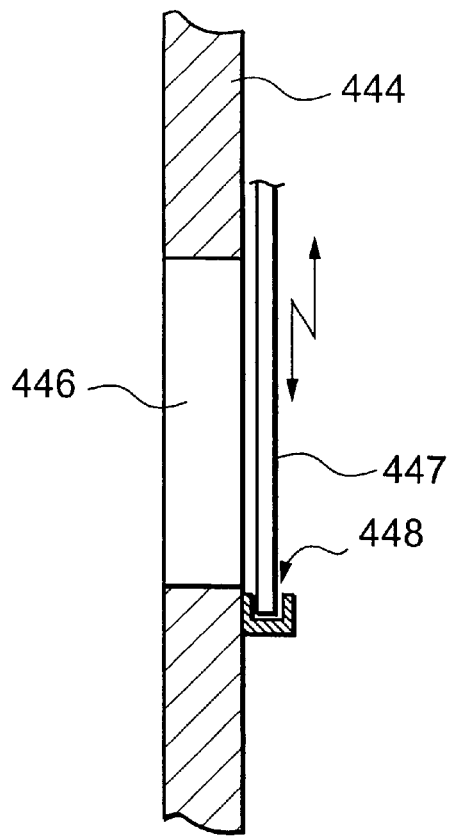
FIG. 12 is an enlarged view of an opening portion in FIG. 11.

An opening portion 446 for carrying the wafer W in/out is provided between the heat processing chamber 441 and the cooling processing chamber 342. The opening portion 446 is provided with a shutter member 447 which is integrated with the lid body 444 and ascends and descends with the lid body 444. As shown in FIG. 12, a fine clearance 448 is provided between the opening portion 446 and the shutter member 447 in a state where the opening portion 446 is closed by the shutter member 447. The provision of such a fine clearance 448 eliminates the need of adjustment for closing and the occurrence of particles.

Figure 13:
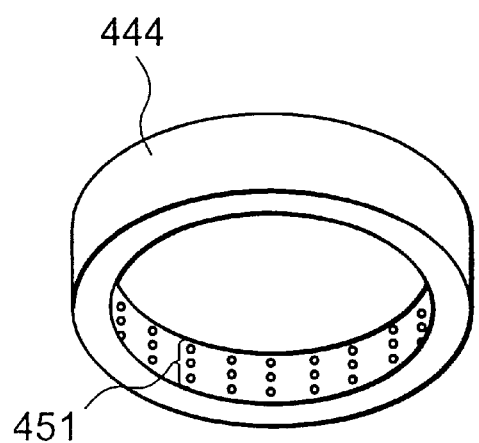
FIG. 13 is a perspective view of a lid body in FIG. 11.
Figure 14:
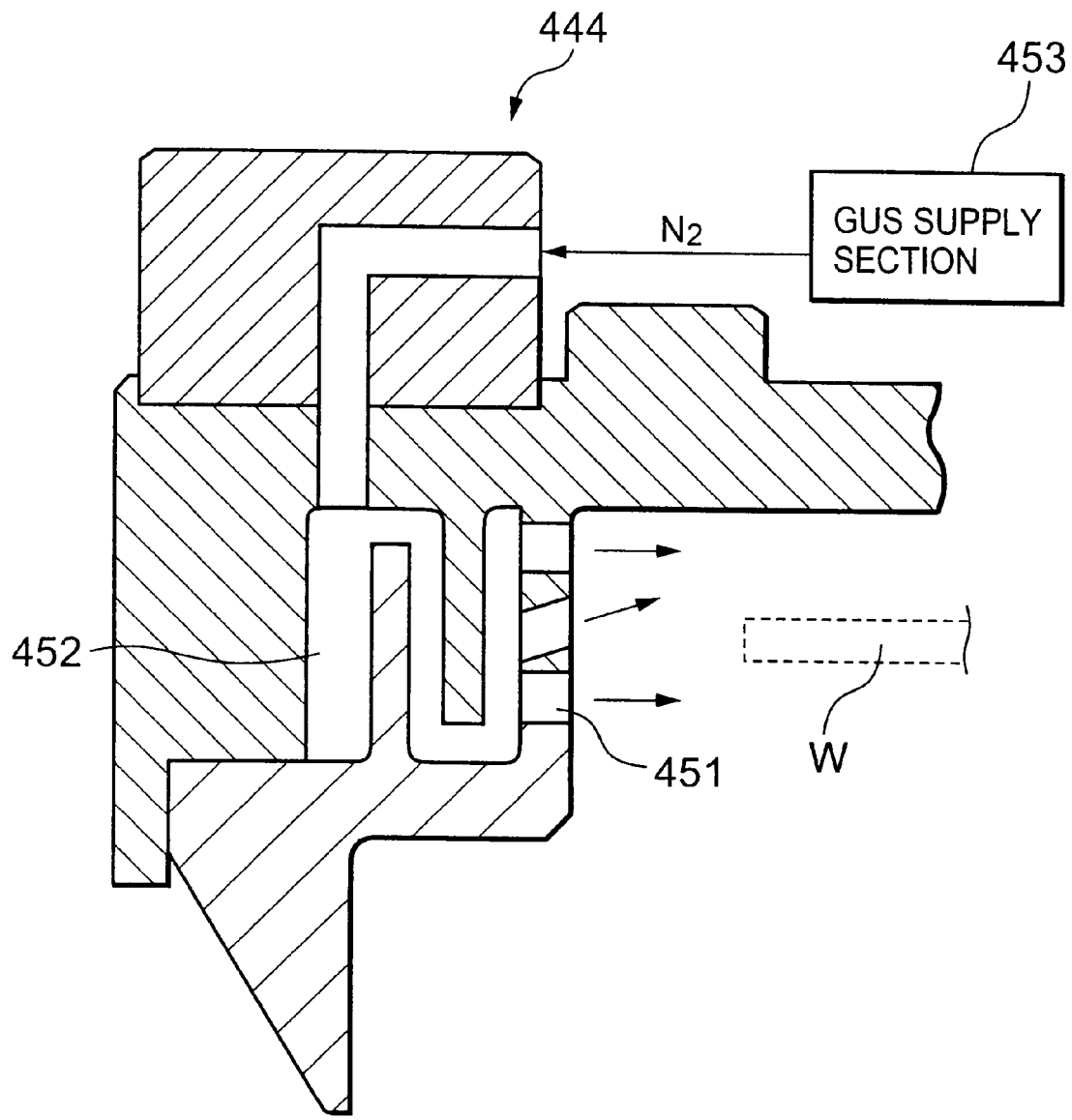
FIG. 14 is an enlarged sectional view of the lid body shown in FIG. 11.

As shown in FIG. 13, provided on the inner side of the outer periphery of the aforesaid lid body 444 are a plurality of, for example, three-column blast ports 451 along the thickness direction (the vertical direction) of the wafer W mounted on the hot plate 443. These blast ports 451 have a hole diameter of, for example, about 2 mm and are provided on the inner side of the outer periphery of the lid body 444 at almost uniform spaced intervals of, for example, 7.2°. At the center of the top portion of the lid body 444 provided is an exhaust port 461, and an exhaust apparatus 462 is connected to the exhaust port 461. Further, as shown in FIG. 14, the lid body 444 is provided with a buffer 452 for temporarily storing an inert gas to be supplied from the blast ports 451 to spread the inert gas to each of the blast ports 451. An inert gas, for example, nitrogen gas is supplied from a gas supply section 453 to a processing region side via the buffer 452 and the blast ports 451. The blast ports 451 in the upper column and the lower column out of the blast ports 451 in the upper, the middle, and the lower columns supply nitrogen gas nearly parallel to the surface of the wafer W and the blast ports 451 in the middle column supply nitrogen gas in a slanting direction with respect to the surface of the wafer W. Thereby, uniform purge becomes possible.

It should be noted that three lifting pins 347, which are supporting members, penetrating the hot plate 443 for raising and lowering the wafer W while the wafer W is mounted thereon are provided to be ascendable and descendable as in the first described embodiment. The lifting pins protrude from the front face of the hot plate 443 to support the wafer W nearly horizontally in a state where they are raised, and retract into the hot plate 443 to mount the wafer on the plate 443 in a state where they are lowered.

In this embodiment, since the blast ports 451 are provided particularly on the lid body 444 side, nitrogen gas jetted from the blast ports 451 is never jetted directly to the hot plate 443. Thereby, the temperature of the hot plate 443 becomes stable.

The present invention is not limited to the aforesaid embodiments and can be modified variously. For example, a substrate to be processed is not limited to a semiconductor wafer, and other substrates such as an LCD substrate and the like are also suitable. Moreover, the kind of a film is not limited to a layer insulating film.

As has been described, according to the present invention, a plurality of blast ports are provided in a shutter member of a substrate heat processing apparatus along a thickness direction of the substrate, whereby a heated inert gas to be supplied via the blast ports is sent to both faces of the substrate while the substrate is supported by supporting members. Accordingly, both the faces of the substrate can be heated at the same time and the substrate surface is uniformly heated, whereby heating unevenness never occurs. Further, heating can be performed by the inert gas during the interval from when the substrate is supported by the supporting members to when it is mounted on the hot plate, whereby the time required for the heat processing can be shortened compared with the case where conventionally a low-oxygen atmosphere is prepared and then heat processing is performed by the hot plate.

Further, according to the present invention, the supply amount of a heated inert gas can be gradually increased in the substrate heat processing apparatus, whereby oxidation of the coating film is prevented, so that heat processing can be efficiently performed. Thereby, the time required for heat processing can be shortened.

Furthermore, the cooling processing apparatus of the present invention comprises an inert gas jet nozzle having a jet port slanting toward the outer periphery of the substrate, so that the inert gas is supplied to the entire face of the substrate without unevenness and cooling unevenness never occurs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for processing a substrate, comprising:
a hot plate on which the substrate is mounted;
an ascendable and descendable supporting member penetrating the hot plate for protruding from a front face of the hot plate to support the substrate in a state where the supporting member is raised and for retracting into the front face of the hot plate to mount the substrate on the hot plate in a state where the supporting member is lowered;
a processing chamber having an ascendable and descendable shutter member disposed to surround the outer periphery of the substrate and provided with a plurality of blast ports along a thickness direction of the substrate mounted on the hot plate, the shutter member forming processing space between the shutter member and the hot plate in a state where the shutter member is raised or lowered; and
inert gas supply means for supplying a heated inert gas into the processing chamber via the blast ports.

2. The apparatus as set forth in claim 1, wherein the substrate supported by said supporting member is positioned at a position to which the substrate is delivered from the outside of said apparatus and near a midpoint of vertically placed blast ports in a state where the shutter member is raised or lowered to form the processing space between the shutter member and said hot plate.

3. The apparatus as set forth in claim 1,
wherein said supporting member to which the substrate is delivered from the outside of said apparatus is lowered to mount the substrate on said hot plate in a state where the shutter member is raised or lowered to form the processing space between the shutter member and said hot plate and the heated inert gas is supplied from the blast ports.

4. The apparatus as set forth in claim 1,
wherein said inert gas supply means exchanges the inside of said processing chamber for the inert gas by supplying the inert gas with gradually increasing the supply amount thereof.

5. An apparatus for processing a substrate, comprising:
a hot plate on which the substrate is mounted;
an ascendable and descendable supporting member penetrating the hot plate for protruding from a front face of the hot plate to support the substrate in a state where the supporting member is raised and for retracting into the front face of the hot plate to mount the substrate on the hot plate in a state where the supporting member is lowered;

an ascendable and descendable lid body disposed to cover the substrate mounted on the hot plate and provided with a plurality of blast ports on the inner side of the outer periphery thereof along a thickness direction of the substrate mounted on the hot plate; and inert gas supply means for supplying a heated inert gas from the blast ports.

6. The apparatus as set forth in claim 5, further comprising:

a raising and lowering mechanism for raising and lowering said lid body.

7. The apparatus as set forth in claim 5, wherein the blast ports are provided on the inner side of the outer periphery of said lid body at almost uniform spaced intervals, and wherein said lid body is provided with a buffer for temporarily storing the inert gas to be supplied from the blast ports to spread the inert gas to each of the blast ports.

8. The apparatus as set forth in claim 5, wherein at least one blast port out of the plurality of blast ports supplies the inert gas almost parallel to the surface of the substrate, and wherein at least one blast port out of the plurality of blast ports supplies the inert gas in a slanting direction with respect to the surface of the substrate.

9. The apparatus as set forth in claim 5, further comprising:

a casing provided to cover said hot plate and said lid body and provided with an opening portion for carrying the substrate to/from said hot plate; and a shutter member ascending and descending integrally with said lid body for opening and closing the opening portion.

10. The apparatus as set forth in claim 9, wherein a fine clearance is provided between the opening portion and the shutter member in a state where the opening portion is closed by the shutter member.

11. An apparatus for processing a substrate which is used for forming a layer insulating film on the substrate, comprising:

a chill plate on which the substrate is mounted;

a processing chamber in which processing space for processing the substrate is formed between the processing chamber and the chill plate;

inert gas supply means for supplying a cooled inert gas; and a current plate provided on the jet port and having a plurality of openings for guiding the inert gas, which is supplied to the inert gas supply means, in a downwardly slanting direction toward an outer periphery of the substrate, wherein the inert gas flows from the openings of said current plate toward the outer periphery of the substrate while spreading radially, thereby preventing air from remaining above a center of the substrate.

12. A method for processing a substrate, comprising the steps of:

(a) carrying a substrate to a position above a hot plate;

(b) lowering the substrate while a heated inert gas is supplied from the outer periphery side of the substrate to both faces of the substrate; and (c) heating the substrate while the substrate is mounted on the hot plate.

13. The method as set forth in claim 12, wherein the supply amount of the heated inert gas is gradually increased in said step (b).

14. The method as set forth in claim 12, wherein the supply amount of the heated inert gas is decreased in said step (c).

* * * * *